United States Patent [19]

Schmitt

[11] 4,363,964
[45] Dec. 14, 1982

[54] INCREMENTAL MEASURING SYSTEM WITH SELECTIVELY DESIGNATED REFERENCE MARKS

[75] Inventor: Walter Schmitt, Traunreut, Fed. Rep. of Germany

[73] Assignee: Dr. Johannes Heidenhain GmbH, Traunreut, Fed. Rep. of Germany

[21] Appl. No.: 209,152

[22] Filed: Nov. 21, 1980

[30] Foreign Application Priority Data

Dec. 5, 1979 [DE] Fed. Rep. of Germany ....... 2948854

[51] Int. Cl.$^3$ .............................................. H01J 3/14
[52] U.S. Cl. .......................... 250/237 G; 250/231 SE
[58] Field of Search ...................... 250/231 SE, 237 G; 356/395, 396; 340/347 P; 235/92 GC

[56] References Cited

U.S. PATENT DOCUMENTS

4,101,764  7/1978  Nelle ................................ 250/237 G
4,229,646  10/1980  Burkhardt et al. ............. 235/92 GC

OTHER PUBLICATIONS

"Lida 55.12" by Dr. Johannes Heidenhain, Mar. 1971, pp. 1-11.

*Primary Examiner*—David C. Nelms
*Attorney, Agent, or Firm*—Hume, Clement, Brinks, Willian & Olds, Ltd.

[57] ABSTRACT

An incremental measuring instrument having a series of fixed reference marks along one edge of the grid scale is disclosed in which a series of movable magnets or occluding screens are located along the opposite edge of the grid scale so that any subset of the total set of reference marks may be designated for control purposes. A scanning unit is provided to scan the scale, and this scanning unit includes a first photosensitive element responsive to the fixed reference marks, and a second photosensitive element mounted in anti-parallel with the first photosensitive element. This second photosensitve element is illuminated by light which varies in intensity according to whether or not the respective reference mark has a magnet or occluding screen associated therewith.

10 Claims, 7 Drawing Figures

FIG. 2a
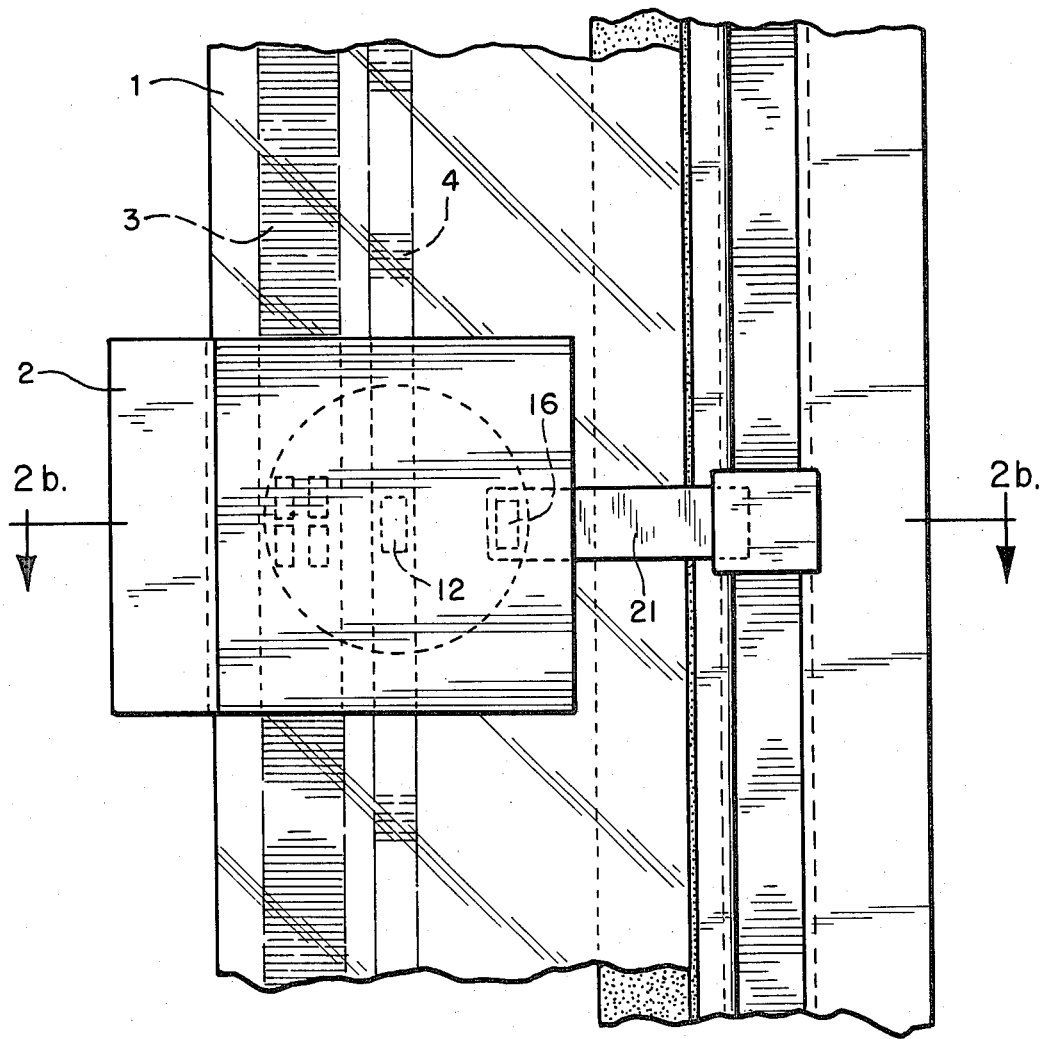
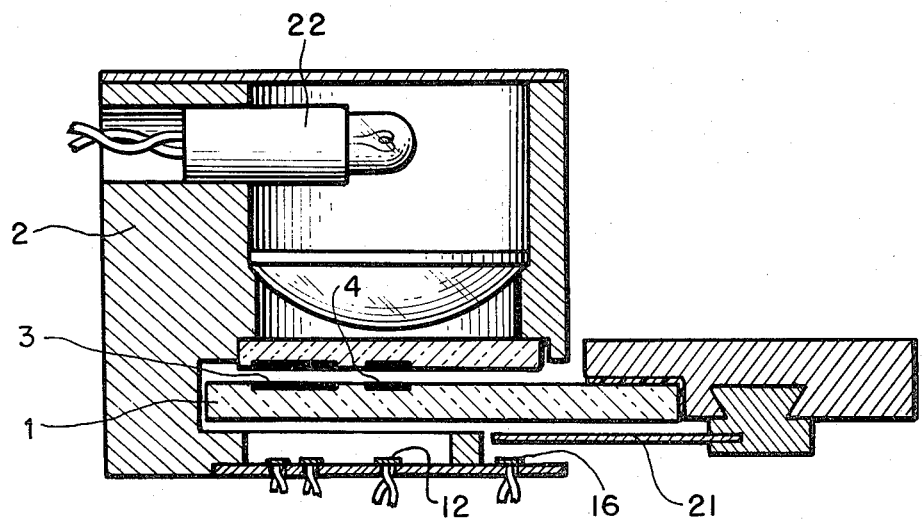
FIG. 2b

INCREMENTAL MEASURING SYSTEM WITH SELECTIVELY DESIGNATED REFERENCE MARKS

BACKGROUND OF THE INVENTION

This invention relates to an improved incremental measuring system of the type having a grid scale, an electronic counter, a plurality of fixed reference marks disposed along the grid scale, and means for generating control signals for controlling the electronic counter in response to a freely selectable subset of the fixed reference marks.

In such measuring systems, the control signals generated in response to the selected reference marks can be used in various manners. For example, such control signals can be used to set the zero position of the electronic counter, to load preselected constant values into the counter at the commencement of the measurement procedure, and for the control or monitoring of interference impulses.

In one type of known incremental measuring instrument, a number of fixed reference marks are applied to the scale during the production of the scale and are fixed in accordance with the requirements of the user at that time. In this type of measuring system, it is not possible to change the number or position of either the reference marks or the associated control impulses.

In order to overcome this drawback of the prior art, it has been proposed in U.S. Pat. No. 4,101,764 (which is assigned to the assignee of the present application) to provide at least one switching means on the scale itself or immediately adjacent thereto. As disclosed more fully in U.S. Pat. No. 4,101,764, the switching means can be used to select one or more of the fixed reference marks to control an electronic counter. In the structure disclosed in the aforementioned patent, a magnet is associated with each of the fixed reference marks that is selected for operation. When the scanning unit moves past the magnet, the magnet actuates an electrical switch included in the scanning unit. An electronic logic component is included in the scanning unit which is responsive both to the electrical switch and to sensor means for sensing the fixed reference marks. This logic circuit produces an impulse control signal for control of the counter only when an electrical signal is provided both by the sensing means and by the magnetically controlled switch of the scanning unit.

SUMMARY OF THE INVENTION

The present invention is directed to an improved incremental measuring system of the type described above which provides freely selectable fixed reference marks and eliminates the need for an electronic logic circuit of the type described above.

According to this invention, an incremental measuring system of the type described above is provided with an impulse generating circuit having two input terminals. A first photosensitive element is connected across the two input terminals of the impulse generating circuit. This first photosensitive element is positioned to scan the plurality of fixed reference marks. A second photosensitive element is connected in parallel with the first photosensitive element and means are provided for illuminating the second photosensitive element. The system of this invention includes at least one switching member mounted adjacent the scale for selectively designating a subset of the fixed reference marks needed for control purposes. This at least one switching member operates selectively to alter the illumination of the second photosensitive element in order selectively to cause the impulse generating circuit to generate control signals only for the designated subset of the reference marks.

One important advantage of the present invention is that fixed reference marks which are not required for a particular application can be deactivated as required by appropriately positioning switching members, such as magnets or optical occluding screens, as appropriate. In particular, the need for electronic logic circuits such as those required by the apparatus shown in U.S. Pat. No. 4,101,764 is completely dispensed with.

The invention itself, together with further objects and attendant advantages, will best be understood by reference to the following detailed description taken in connection with the accompanying drawings.

BRIEF DESCRIPTION OF THE DRAWINGS

FIG. 2a shows a plan view of a second preferred embodiment of the invention which includes an occluding screen.

FIG. 2b is a sectional view taken along line 2b-2b of FIG. 2a.

DETAILED DESCRIPTION OF THE PREFERRED EMBODIMENTS

Figure 1:
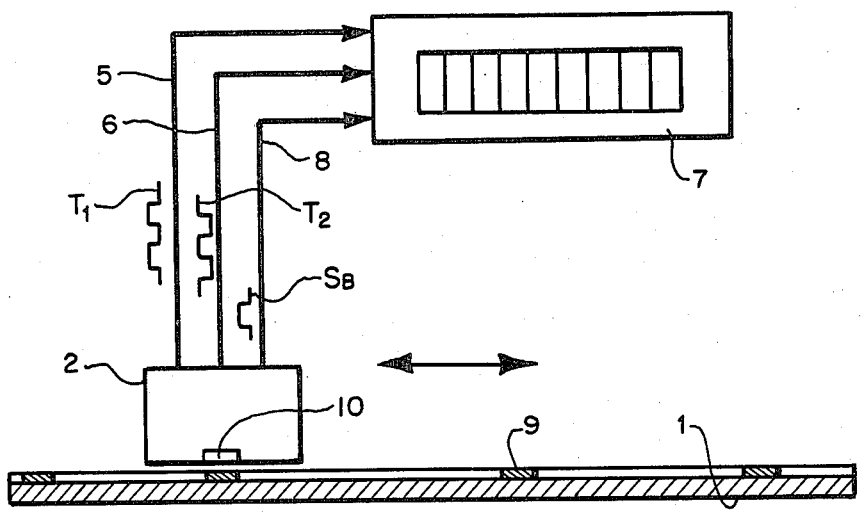
FIG. 1 shows a schematic representation of a first preferred embodiment of the incremental measuring system of this invention.

Referring now to the drawings, FIG. 1 shows a schematic representation of a first preferred embodiment of the present invention. This first preferred embodiment includes a measuring scale 1 and a scanning unit 2. In this embodiment, the measuring scale 1 is formed of metal and it includes a line grid 3 (see FIG. 2). The line grid 3 of the scale 1 is scanned photoelectrically by the scanning unit 2 without direct contact between the scanning unit 2 and the measuring scale 1. Along with the line grid 3 there are provided a series of fixed reference marks 4 on the scale 1. Each of the fixed reference marks 4 includes a set of line markings. The scanning unit 2 includes means for scanning the line grid 3 to generate square wave signals $T_1, T_2$ on electrical leads 5,6, respectively. These square wave signals $T_1, T_2$ are applied to an electronic counter 7 which displays the measured position of the scanning unit 2 in digital form. The scanning unit 2 also includes means for sensing the fixed reference marks 4 and for amplifying the sensed signal to produce an impulse signal $S_B$ on line 8. The impulse signal $S_B$ is applied to the electronic counter 7 as a control signal. For example, the signal $S_B$ can be used to reset the counter to zero. Incremental measuring systems with fixed reference marks are known and described, for example, in the brochure of the firm of Dr. Johannes Heidenhain GmbH, Traunreut, West Germany "LIDA 55.12", in particular FIG. 2, second edition, March 1971. U.S. Pat. No. 4,101,764, which discloses further features of such measuring systems, is hereby incorporated by reference herein.

Figure 2:
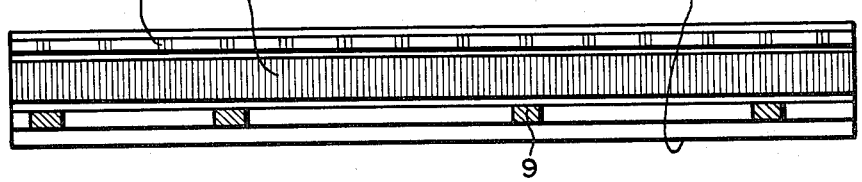
FIG. 2 shows a plan view of the grid scale of the embodiment of FIG. 1.
Figure 3:
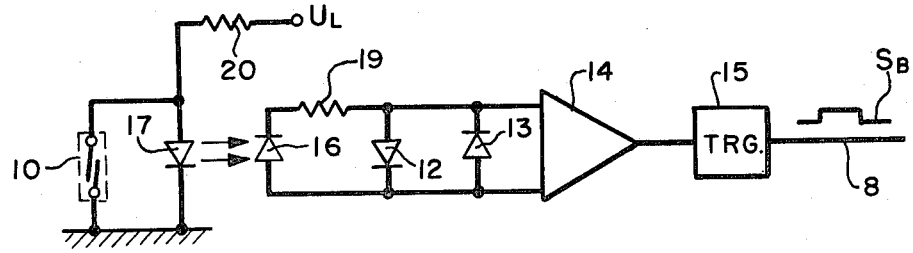
FIGS. 3, 4 and 5 are schematic drawings of circuit arrangements suitable for use in the embodiment of FIGS. 1 and 2.
Figure 4:
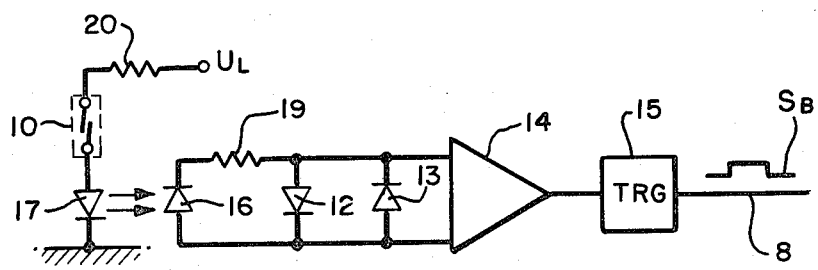
Figure 5:
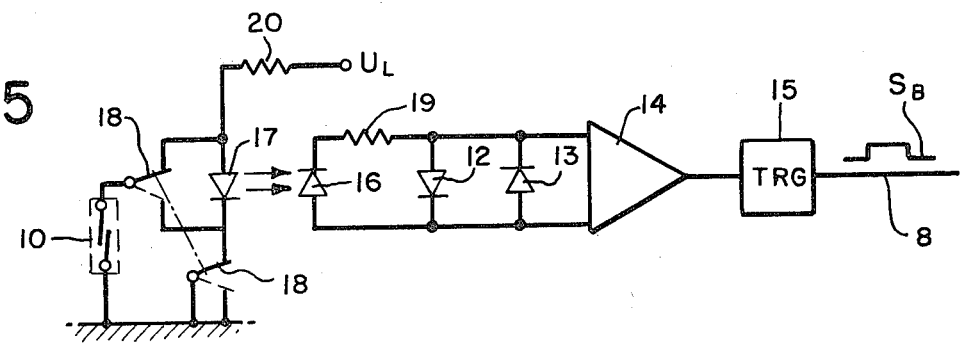

The embodiment of FIGS. 1 and 2 includes means for selecting which of the fixed reference marks 4 are to go into operation or alternately which are not to go into operation. This means for selecting includes a plurality of switching members which in this embodiment comprise magnets 9. Preferably, these magnets 9 are adjustably mounted along the measuring direction such that each magnet 9 can be operatively positioned with respect to a selected one of the fixed reference marks 4. Preferably, the scanning unit 2 includes a magnetically activated reed switch 10 mounted on the scanning unit 2 to move over the magnets 9. Thus, when the scanning unit 2 is positioned with the reed switch 10 over one of the magnets 9, the reed switch 10 is switched by the respective magnet 9. As shown in FIGS. 3–5, the scanning unit 2 includes two photosensitive elements 12,13 which are connected in each case anti-parallel to one another to the two input terminals of an amplifier 14 which is in turn connected to a trigger stage 15. The first photoelectric element 12 is positioned to scan the series of fixed reference marks 4. This first photosensitive element 12 generates a signal that is amplified by the amplifier 14 to form a square wave impulse signal $S_B$ at the output of the trigger stage 15. As explained above, this impulse signal $S_B$ is used as a control signal, and is applied to the counter 7 by means of an electrical lead 8. The second photosensitive element 13, which is illuminated by a constant intensity light source, serves for adjusting the zero point of the signal generated by the first photosensitive element 12, and consequently the effective threshold level of the trigger stage 15.

As shown in FIGS. 3–5, an additional photosensitive element 16 is connected in anti-parallel with the photosensitive element 12. This additional photo-sensitive element 16 is illuminated by a light-emitting diode 17. In the embodiment of FIG. 3, the light-emitting diode 17 is connected via a resistor 20 to a supply voltage $U_L$. Preferably, the supply voltage $U_L$ is the same supply voltage used to power the illumination lamp for the scale 1. In addition, a magnetically operated reed switch 10 is connected in parallel with the light-emitting diode 17. In the embodiment of FIG. 3, the fixed reference marks 4 are scanned by the photosensitive element 12. Those reference marks 4 which are not to go into operation have no magnets 9 associated therewith. When the scanning unit 2 is positioned over one of these deactivated reference marks 4, the reed switch 10 is not actuated, and therefore the light-emitting diode 17 is illuminated. This causes the photosensitive element 16 to generate a cancelling signal which tends to cancel the signal generated by the photosensitive element 12. When this cancelling signal is present, the signal generated by the photosensitive element 12 is shifted in such a way that the trigger threshold of the trigger stage 15 is not reached. Accordingly, no control signals $S_B$ are generated for those fixed reference marks to which no magent is allocated. On the other hand, when a magnet 9 is allocated to a fixed reference mark 4, the reed switch 10 is actuated by the magnet 9 so that the photosensitive element 16 is either not illuminated by the light-emitting diode 17 or is only weakly illuminated by it. In this case, the signals generated by the photosensitive element 12 in response to the fixed reference mark 4 exceed the threshold level of the trigger stage 15, causing the trigger stage 15 to generate control signals $S_B$, which are then applied to the counter 7. The circuit of FIG. 3 is particularly preferred for use in the case in which only a small subset of the total number of fixed reference marks 4 are to go into operation.

If, on the other hand, the major portion of the fixed reference marks 4 are to go into operation it is preferred to use the circuit of FIG. 4. In the circuit of FIG. 4, the light-emitting diode 17 illuminates the photosensitive element 16 whenever the reed switch 10 is closed. On the other hand, when the reed switch 10 is open circuited, the light-emitting diode 17 does not illuminate the photosensitive element 16. In using the circuit of FIG. 4 each of the unneeded fixed reference marks 4 has a magnet 9 allocated therewith. These magnets 9 activate the reed switch 10, causing the photodiode 17 to illuminate the photosensitive element 16, and thereby causing the associated fixed reference marks 4 not to become active.

In an especially preferred embodiment of the invention, the circuit of FIG. 3 and the circuit of FIG. 4 are combined, as shown in FIG. 5. In the circuit of FIG. 5, a two pole switch 18 is provided which allows the user to choose either the mode of operation described above in connection with FIG. 3 or, alternately, the mode of operation described above in connection with FIG. 4.

Instead of the photoelectric element 16 and the light-emitting diode 17 an integrated optical coupler can be placed in parallel with the photosensitive element 12. The reed switch 10 can also be replaced, for example, by a magnetically controllable semiconductor such as a magnetically controlled semiconductor resistor (a magneto resistor).

As shown in FIGS. 2a and 2b, the illumination or non-illumination of the photosensitive element 16 can be controlled by an occluding screen 21 instead of by the combination of the magnets 9 and the reed switch 10. In the embodiment of FIGS. 2a and 2b, the occluding screen 21 functions as a switching member, similar to the magnets 9. Preferably, occluding screens 21 are allocated to the respective fixed reference marks 4 as appropriate. Preferably, the photosensitive element 16 is illuminated by light from the illumination lamp 22 for the scale 1 in the absence of an occluding screen 21. When present, the occluding screen 21 serves to block the illumination of the photosensitive element 16 by the lamp 22. As shown in FIG. 2b, the occluding screens 21 can be slidably mounted to move along the measuring direction, and the movement of these occluding screens can be performed either manually or by remote control. The resistor 19 of FIGS. 3–5 is provided to keep the tolerances of the photocurrent of the photosensitive element 16 in consequence of saturation effect small.

It should be understood that the invention is not restricted to the preferred embodiments described above. On the contrary, many modifications and changes to the preferred embodiments described above will be apparent to those skilled in the art. Thus, for example, in the case of enclosed incremental measuring systems such as the system shown in West German Gebrauchmuster 75 04 025, the magnets 9 or the occluding screen 21 can be arranged inside the hollow housing which acts to shield the scale from environmental influences. One skilled in the art would certainly be expected to make such modifications and variations to the preferred embodiments described above without departing from the spirit and scope of the invention as it is defined in the following claims.

I claim:

1. In an incremental measuring system including a grid scale; an electronic counter; a plurality of fixed reference marks along the grid scale; a movable scanning unit; sensor means, included in the scanning unit, for generating an electrical impulse in conjunction with the reference marks for control of the electronic counter; at least one switching member mounted adjacent the scale for selectively designating a subset of the fixed reference marks needed for control purposes; and means, responsive to the at least one switching member, for selectively enabling the sensor means only for the designated subset of the reference marks, the improvement comprising:

an impulse generating circuit, connected to the sensor means for generating the electrical impulse, said impulse generating circuit having two input terminals;

a first photosensitive element included in the sensor means and connected across the two input terminals of the impulse generating circuit, said first photosensitive element positioned to scan the plurality of fixed reference marks;

a second photosensitive element, included in the enabling means and connected in parallel with the first photosensitive element; and means for illuminating the second photosensitive element;

said switching member operating selectively to alter illumination of the second photosensitive element by the illuminating means in order selectively to enable the sensor means only for the designated subset of the reference marks.

2. The invention of claim 1 wherein the illuminating means include a light-emitting diode positioned to illuminate the second photosensitive element.

3. The invention of claim 1 wherein the second photosensitive element and the illuminating means are included in an optical coupler connected in parallel with the first photosensitive element.

4. The invention of claim 1 wherein each of the at least one switching members comprises a magnet and said enabling means includes electrical switch means, responsive to each of the magnets, for altering the operation of the illuminating means.

5. The invention of claim 4 wherein the switch means comprises a reed switch.

6. The invention of claim 4 wherein the switch means comprises a magnetically controllable semiconductor resistor.

7. The invention of claim 4 further including means for adjustably mounting the magnets adjacent the scale such that the magnets can be selectively positioned in the direction of movement of the scanning unit to designate the desired subset of fixed reference marks.

8. The invention of claim 1 or 4 further including a bending resistant housing for protecting the scale and the scanning unit from environmental influences, wherein the at least one switching member is positioned inside the housing.

9. The invention of claim 1 wherein each of the at least one switching members comprises an occluding screen positioned to alter illumination of the second photosensitive element when the first photosensitive element is positioned to scan the reference mark associated with the at least one switching member.

10. The invention of claim 9 further including means for slidably mounting the occluding screens adjacent the scale such that the occluding screens can be positioned to designate the desired subset of fixed reference marks.

* * * * *